United States Patent
Lee et al.

(10) Patent No.: US 9,969,618 B2
(45) Date of Patent: May 15, 2018

(54) HOT PRESS INDUCED FORMATION OF AN ORDERED GRAPHENE AND FEW LAYERED GRAPHENE SHEETS

(71) Applicant: National University of Singapore, Singapore (SG)

(72) Inventors: Jonghak Lee, Singapore (SG); Barbaros Özyilmaz, Singapore (SG)

(73) Assignee: National University of Singapore, Singapore (SG)

( * ) Notice: Subject to any disclaimer, the term of this patent is extended or adjusted under 35 U.S.C. 154(b) by 40 days.

(21) Appl. No.: 15/035,039

(22) PCT Filed: Nov. 17, 2014

(86) PCT No.: PCT/SG2014/000539
§ 371 (c)(1),
(2) Date: May 6, 2016

(87) PCT Pub. No.: WO2015/072926
PCT Pub. Date: May 21, 2015

(65) Prior Publication Data
US 2016/0272498 A1    Sep. 22, 2016

Related U.S. Application Data

(60) Provisional application No. 61/904,972, filed on Nov. 15, 2013.

(51) Int. Cl.
*C01B 31/02* (2006.01)
*C23C 14/24* (2006.01)
(Continued)

(52) U.S. Cl.
CPC .............. *C01B 31/02* (2013.01); *B05D 3/007* (2013.01); *B05D 3/107* (2013.01);
(Continued)

(58) Field of Classification Search
CPC . C01B 31/04; C01B 31/0407; C01B 31/0415; C01B 31/0423; C01B 31/043;
(Continued)

(56) References Cited

U.S. PATENT DOCUMENTS 5,744,510 A    4/1998  Pekala
9,725,322 B2   8/2017  Ghosh et al.
(Continued)

FOREIGN PATENT DOCUMENTS

WO    WO 2013/066269 A1    5/2013
WO    WO 2015/072926 A1    5/2015

OTHER PUBLICATIONS

Parvizi, et al., Properties of graphene produced by the high pressure-high temperature growth process, Micro & Nano Letters 2008; 3(1): 29-34.*
(Continued)

*Primary Examiner* — Daniel C McCracken
(74) *Attorney, Agent, or Firm* — Hamilton, Brook, Smith & Reynolds, P.C.

(57) ABSTRACT

A method of making an ordered crystalline product includes hot pressing amorphous carbon at an elevated temperature and pressure to form an ordered crystalline product.

13 Claims, 4 Drawing Sheets

(51) Int. Cl.
| | |
|---|---|
| C23C 14/58 | (2006.01) |
| C30B 29/02 | (2006.01) |
| C23C 16/56 | (2006.01) |
| B05D 3/00 | (2006.01) |
| C30B 1/02 | (2006.01) |
| C23C 14/06 | (2006.01) |
| C23C 16/26 | (2006.01) |
| C01B 31/04 | (2006.01) |
| B05D 3/10 | (2006.01) |

(52) U.S. Cl.
CPC ...... *C01B 31/0446* (2013.01); *C23C 14/0605* (2013.01); *C23C 14/24* (2013.01); *C23C 14/5886* (2013.01); *C23C 16/26* (2013.01); *C23C 16/56* (2013.01); *C30B 1/023* (2013.01); *C30B 29/02* (2013.01); *C01P 2002/82* (2013.01); *C01P 2006/10* (2013.01); *C01P 2006/40* (2013.01)

(58) Field of Classification Search
CPC ............ C01B 31/0438; C01B 31/0446; C01B 31/0453; C01B 31/0461; C01B 31/0469; C01B 31/0476; C01B 31/0484; C01B 31/0492; C01B 2204/00; C01B 2204/02; C01B 31/02; C30B 1/023; C30B 29/02; C23C 16/56; C23C 16/26; C23C 14/5886; C23C 14/24; C23C 14/0605; B05D 3/107; B05D 3/007; C01P 2006/40; C01P 2006/10; C01P 2002/82
See application file for complete search history.

(56) References Cited

U.S. PATENT DOCUMENTS

| | | |
|---|---|---|
| 2008/0277284 A1 | 11/2008 | Nesbitt |
| 2009/0061191 A1 | 3/2009 | Zhamu et al. |
| 2012/0045384 A1 | 2/2012 | Muramatsu et al. |
| 2016/0002044 A1 | 1/2016 | Ghosh et al. |

OTHER PUBLICATIONS

Chernogorova, et al., Structure and physical properties of nanoclustered graphene synthesized from C60 fullerene under high pressure and high temperature, Appl. Phys. Lett. 2014; 104: 043110-1 to 043110-4.*

Lion Specialty Chemicals Co., Ltd., "Ketjenblack Highly Electro-Conductive Carbon Black", retrieved online Sep. 7, 2016; www.lion-specialty-chem.co.jp/en/product/carbon.

AkzoNobel. "Ketjenblack® EC-600JD powder", Apr. 2011. p. 1-2.

Ali, A.A., et al., "Hot-pressed Electrospun PAN nano fibers: An Idea for Flexible Carbon Mat.," Journal of Materials processing Technology, 2009, vol. 209, No. 9, pp. 4617-4620.

Caldwell, Marissa A., et al., "Synthesis and Size-dependent Crystallization of Colloidal Germanium Telluride Nanoparticles," Royal Society of Chemistry, 2010, J. Mater. Chem., 2010, vol. 20, pp. 1285-1291.

Childres, Isaac, et al., "Raman Spectroscopy of Graphene and Related Materials," Chapter 19 of New Developments in Photon and Materials Research (Joon I. Jang, Ed.) (Jul. 8, 2013).

Chung, D.D.L., "Review Graphite", *Journal of Materials Science*, 37: 1475-1489 (2002).

Cooper, Daniel R., et al., "Experimental Review of Graphene," ISRN Condensed Matter Physics, vol. 2012, Article ID 501686, (Accepted Nov. 3, 2011) Copyright 2012.

Fedorov, A.V. and Shulgin, A.V., "Mathematical Modeling of Melting of Nano-Sized Metal Particles," Combustion, Explosion, and Shock Waves, vol. 47, No. 2, pp. 147-152, 2011.

Ghosh, Arunabha and Lee, Y.H., "Carbon-Based Electrochemical Capacitors," ChemSusChem 2012, vol. 5, pp. 480-499.

Ji, Hengxing, et al., "Ultrathin Graphite Foam: A Three-Dimensional Conductive Network for Battery Electrodes," Nano Letters, 2012, vol. 12, pp. 2446-2451 (and Supporting Information).

Jorio, Ado, et al., "Measuring Disorder in Graphene With Raman Spectroscopy," (2011), Physics and Applications of Graphene—Experiments, Dr. Sergey Mikhailov (Ed.), ISBN: 978-953-307-217-3.

Marco-Lozar, J.P. et al., "Activated Carbon Monoliths for Gas Storage at Room Temperature," Energy & Environmental Science, 2012, vol. 5, pp. 9833-9842.

Moore, A.W., et al., "Stress Recrystallization of Pyrolytic Graphite," Proceedings of The Royal Society of London, A 1964 280, pp. 153-169.

Notification Concerning Transmittal of International Preliminary Report on Patentability for International Application No. PCT/SG2014/000539, entitled "Hot Press Induced Formation of an Ordered Graphene and Few Layered Graphene Sheets", dated May 26, 2016.

Notification of Transmittal of the International Search Report and The Written Opinion of the International Searching Authority dated Feb. 25, 2015 for International Application No. PCT/SG2014/000539 filed Nov. 17, 2014, entitled "Hot Press Induced Formation of an Ordered Graphene and Few Layered Graphene Sheets".

Valov, P.M. and Leĭman, V.I., "Size Effects in Melting and Crystallization Temperatures of Copper Chloride Nanocrystals in Glass," 1997 American Institute of Physics, Fiz. 66, No. 7, pp. 481-486, Oct. 10, 1997.

Xia, Yongde, et al., "Porous Carbon-Based Materials for Hydrogen Storage: Advancement and Challenges," Journal of Materials Chemistry A, 2013 vol. 1, pp. 9365-9381.

Yang, Zhi-Yu, et al., "Sponge-Templated Preparation of High Surface Area Graphene With Ultrahigh Capacitive Deionization Performance," Advance Functional Materials, 2014, vol. 24, pp. 3917-3925.

Zhang, Yupeng, et al., "High Quality Graphene Sheets From Graphene Oxide by Hot-Pressing,", Carbon, Nov. 14, 2012, vol. 54, pp. 143-148.

* cited by examiner

HOT PRESS INDUCED FORMATION OF AN ORDERED GRAPHENE AND FEW LAYERED GRAPHENE SHEETS

RELATED APPLICATION(S)

This application is the U.S. National Stage of International Application No. PCT/SG2014/000539, filed Nov. 17, 2014, which designates the U.S., published in English, and claims the benefit of U.S. Provisional Application No. 61/904,972, filed Nov. 15, 2013. The entire teachings of the above applications are incorporated herein by reference.

BACKGROUND OF THE INVENTION

Large scale synthesis of graphene by copper-based rapid thermal chemical vapor deposition (RT-CVD) methods has been evaluated as a potential route for manufacturing graphene on a commercial scale. Unfortunately, RT-CVD graphene production processes consists of many complex steps, which necessitate precise control of gas composition, flow rates, and other parameters that are challenging to control with precision in a commercial-scale process. It is also difficult to control the number of graphene layers produced and to remove the graphene from the catalytic surface without damaging the graphene layer. Accordingly, there is a need for improved processes for manufacturing graphene, particularly those that are suitable for commercial-scale production.

SUMMARY OF THE INVENTION

Described herein is a method of making an ordered carbon product. The method includes hot pressing amorphous carbon at a pressure between about 1 MPa and about 1 GPa, at a temperature between about 500° C. and about 2,100° C., and for a duration between about 5 minutes and about 10 hours, to form an ordered carbon product. In some instances, the pressure is between about 10 MPa and about 100 MPa. In other instances, the pressure is between about 10 MPa and about 40 MPa. In other instances, the pressure is between about 40 MPa and about 100 MPa. In some instances the temperature is between about 1,400° C. and about 2,100° C. In other instances, the temperature is between about 800° C. and about 2,100° C. In some instances, the duration is between about 5 minutes and about 10 hours; or between about 5 minutes and about 3 hours; or between about 5 minutes and about 60 minutes; or between about 1 hour and about 10 hours; or between about 1 hour and about 3 hours; or between about 30 minutes and about 3 hours; or between about 30 minutes and about 1 hour. The ordered carbon product can be formed on a non-planar substrate. The method can further include depositing the amorphous carbon on to a substrate prior to hot pressing the amorphous materials. The amorphous carbon can be deposited by chemical vapor deposition or physical vapor deposition. The physical vapor deposition can be sputtering or evaporation. The amorphous carbon can be formed by carbonization of a polymeric material coated on the substrate. The polymeric material can be poly(methyl methacrylate), polydimethylsiloxane, poly(p-phenylene-1,3,4-oxadiazole), or polyimide.

Described herein is an ordered carbon product having a density between about 0.361 g/cm$^3$ and about 2.25 g/cm$^3$ and a conductivity between about $1 \times 10^4$ and about $1 \times 10^8$ S/m.

Described herein is an ordered carbon product having an $I_D/I_G$ ratio between about 0 and about 5 as measured by Raman spectroscopy with a 532 nm excitation laser.

Described herein is, an ordered carbon product having an $A_D/A_G$ ratio of about 0.63 as measured by Raman spectroscopy with a 532 nm excitation laser.

The inventors have discovered that, unexpectedly, hot pressing can be used to transform an amorphous starting material into a crystalline product. Notably, the starting material is amorphous, and is not a highly-ordered material. Additionally, the substrate on which the graphene is formed need not be a catalytic surface. A wide variety of substrates capable of withstanding the heat and pressure of the hot pressing process are suitable.

Producing graphene by the processes described herein provides a number of advantages. Notably, hot pressing provides a simpler, more economical process for producing commercial-scale quantities of graphene. Whereas CVD methods require a large number of process steps that must be tightly controlled, hot pressing includes a small number of steps, and the operating parameters need not be as tightly controlled. Additionally, graphene having a large surface area can be created in a single pressing operation.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Graphene is a two dimensional sheet of carbon that has highly desirable physical properties for use in tissue regeneration, medical devices, and flexible and transparent electronics. Graphene is the strongest material known having a Young's modulus of 0.5-1 TPa, yet it is extremely flexible and not brittle. Graphene can be transferred onto any flat or irregular shaped surface and graphene-coated, flexible, supporting substrates can be easily bent into any shape required.

Graphene can be single-layer or multi-layer graphene. The term "multi-layer graphene" refers to graphene that has multiple layers of single atomic layer graphene. In one embodiment, graphene is multi-layer graphene. The graphene can have between about 1 to about 20 layers. In some instances, the graphene can have between about 1 layer and about 15 layers; in other instances, it can have between about 2 layers and about 10 layers; and in other instances, it can have between about 2 layers and about 5 layers.

As used herein, the term "single layer graphene" refers to a graphene monoatomic sheet that has less than or about 5% of two or three layer graphene. In another embodiment of the invention, the graphene is single layer graphene. In one non-limiting embodiment, the graphene has about 5% two and three layer graphene. In another embodiment, graphene has less than 5% two and three layer graphene.

Amorphous carbon refers to carbon that does not have a crystalline structure. In other words, the carbon atoms of amorphous carbon do not have a periodic, repeating pattern. Amorphous carbon is distinguished from diamond, graphite and graphene, each of which has a distinct crystalline structure. One of skill in the art will recognize that amorphous carbon can, however, have some short-range order, also referred to as local ordering that is not repeated throughout the entirety of the carbon. For example, five percent or less of the carbon atoms can have a periodic, repeating pattern. One particular type of amorphous carbon is carbon black.

An ordered carbon product is distinguished from amorphous carbon because it has a periodic, repeating pattern, which is also referred to as an ordered structure. One of skill in the art will recognize that an ordered carbon product can have portions that do not have a periodic, repeating pattern; however, the periodic, repeating pattern is the predominant structure.

Figure 1:
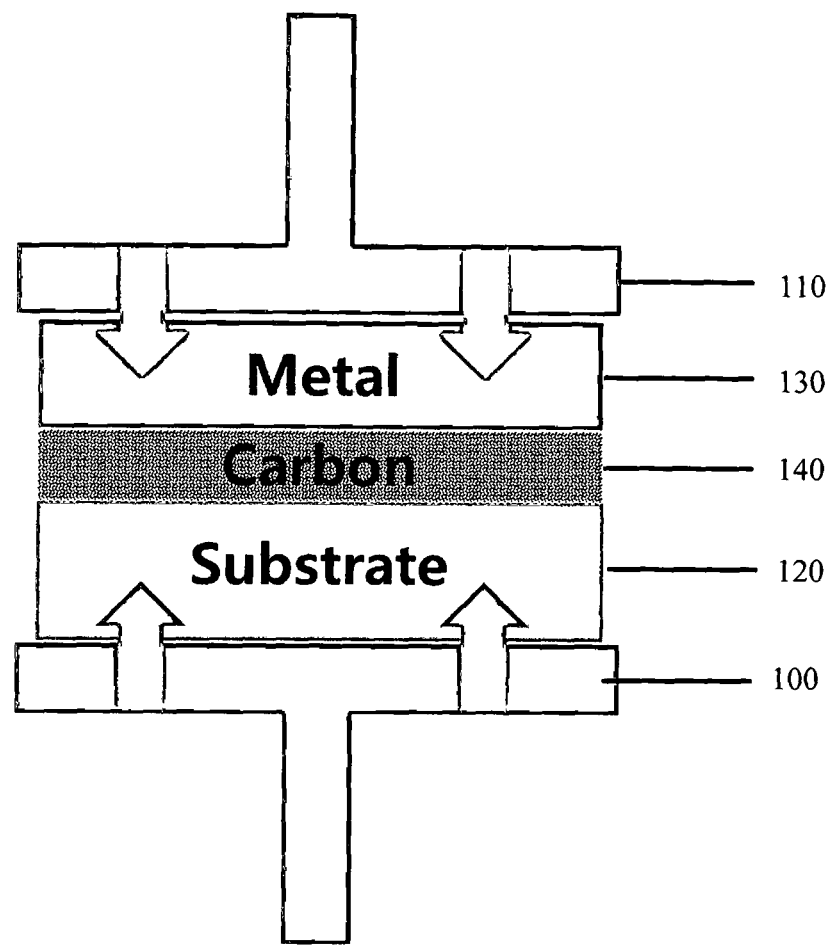
FIG. 1 is a schematic illustrating hot pressing of amorphous carbon.

Hot pressing refers to the application of an elevated pressure and temperature. As used herein, amorphous carbon can be hot pressed in order to cause it to adopt an ordered structure. FIG. 1 is an illustration of an apparatus for hot pressing. The apparatus has a lower surface 100 and an upper surface 110. Either the lower surface 100 or the upper surface 110 is adapted to exert mechanical force toward the other. The lower surface 100 supports a substrate 120. In some instances, the lower surface 100 and substrate 120 can be the same. Affixed to the upper surface 110 is an optional metal structure 130, which can reduce undesirable contamination or reaction. In some instances, the upper surface 110 and optional metal structure 130 can be the same. As illustrated, amorphous carbon 140 is disposed between the substrate 120 and metal structure 130.

Figure 2:
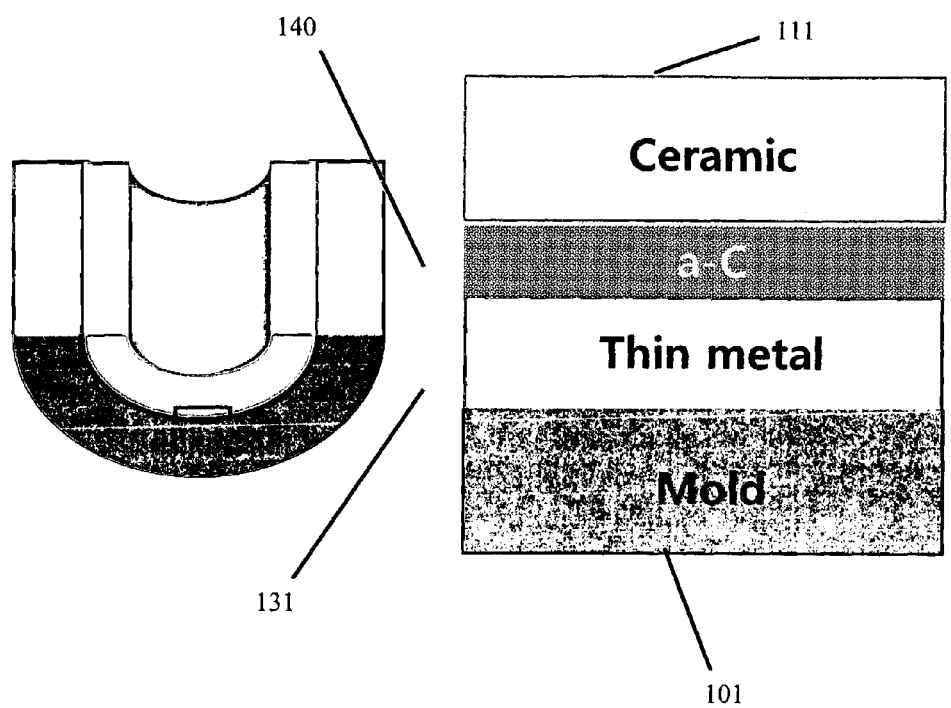
FIG. 2 is a schematic illustrating hot pressing of amorphous carbon on a ceramic substrate.

FIG. 2 is an illustration of another apparatus for hot pressing. The apparatus has a lower surface 101, which can be referred to as a mold. As illustrated, the lower surface 101 supports an optional metal structure 131. As illustrated, an upper surface 111 is formed of ceramic, though other materials of construction can be used. As illustrated, amorphous carbon 140 is disposed between the upper surface 111 and the metal structure 131, and mechanical force is applied by pressing one or more of the lower surface 101 and the upper surface 111 toward the other. As illustrated, one or more of the lower surface 101 and upper surface 111 can be non-planar, thereby permitting the fabrication of graphene on non-planar surfaces.

In some instances, amorphous carbon can be formed on the substrate by carbonization of a polymeric material. Relevant polymers include poly(methyl methacrylate), polydimethylsiloxane, poly(p-phenylene-1,3,4-oxadiazole), or polyimide. Other carbon-containing polymers can also be used. The polymeric materials can be coated on the substrate, such as by bar coating or spin coating methods. The polymeric materials can be carbonized to form the amorphous carbon. The carbonization process can entail heating the polymer, typically to between about 100° C. and about 700° C. under a vacuum or inert gas for between about one hour and five hours.

Typically, the pressure is applied along a single axis, which is perpendicular to the surface of the substrate. The applied mechanical force between the lower surface 100 and the upper surface 110 can range from about 1 MPa to about 1 GPa. In some instances, the force applied can range from about 10 MPa to about 100 MPa, or from about 10 MPa to about 40 MPa, or from about 40 MPa to about 100 MPa. Even higher pressures are permissible. While the amorphous carbon is being mechanically pressed, the heat is raised to an elevated temperature.

Hot pressing can be conducted at a temperature of about 500° C. and about 2,100° C.; or between about 800° C. and about 2,100° C.; or between about 1,400° C. and about 2,100° C. Even higher temperatures are permissible, and the maximum temperature depends on the melting point of the substrate. Notably, however, the temperatures and pressures can be lower than those for the recrystallization of pyrolitic graphite (e.g., 3,400° C. and 40 MPa). Example substrates and maximum suitable temperatures are listed in Table 1. Many other substrates are suitable, including those having higher maximum recommended temperatures than those listed in Table 1. The hot pressing process is conducted under a vacuum or in an inert atmosphere (e.g., He, Ar, or $N_2$). Typically, the amorphous material is hot pressed for between 5 minutes and 10 hour; or between 5 minutes and 3 hours; or between 5 minutes and 60 minutes; or between 1 hour and 10 hours; or between 1 hour and 3 hours; or between 30 minutes and 3 hours; or between 30 minutes and 1 hour. At around the recrystallization temperature, the deposited amorphous carbon will be recrystallized in plane, resulting in an ordered graphene structure.

TABLE 1

| Substrate | Maximum Temperature (° C.) |
| --- | --- |
| Copper | 1,083 |
| Gold | 1,063 |
| Nickel | 1,452 |
| Platinum | 1,772 |
| Palladium | 1,552 |
| Boron nitride* | 2,200 |
| $SiO_2$ | 1,725 |
| $Al_2O_3$ | 2,072 |
| MgO** | 2,200 |
| Zirconia*** | 2,200 |

*The maximum recommended temperature for boron nitride is 2,200° C., even though the melting point of hexagonal boron nitride is 2,973° C.
**The maximum recommended temperature for MgO is 2,200° C., even though the melting point of MgO is 2,852° C.
***The maximum recommended temperature for zirconia is 2,200° C., even though the melting point of $ZrO_2$ is 2,715° C.

In each of the three cases, the maximum recommended temperature is less than the melting point of the substrate due to limitations of the experimental hot pressing apparatus, though this temperature limitation can be overcome with a different hot pressing apparatus. Additionally, higher temperatures can promote undesirable carbothermal reactions of the substrate.

When produced by the hot pressing method, graphene can be formed on a wide variety of substrates. Advantageously, hot pressing does not require a catalytic substrate. In contrast, chemical vapor deposition and other synthetic methods require a catalytic substrate. Typically, the catalytic substrate for CVD methods is a metal substrate, such as copper. Accordingly, the hot pressing method is suitable for forming graphene on a variety of substrates, including silicon oxide and other glasses, ceramics, metals, non-metals, and other substrates capable of withstanding the elevated temperature and pressure of the hot pressing method.

The graphene layer (e.g., first graphene layer, second graphene layer, third graphene layer, etc.) can be unpatterned or patterned. As used herein, "patterning" can refer to pre-patterning and post-patterning processes. Patterning can be used to make numerous arrangements and patterns in the graphene structures. Non-limiting examples include one or more of the following patterns: crossbars, bars, stripes, circles, random diamonds, rectangles, spheroids, parallelograms, or hatches.

Pre-patterning means patterning prior to hot pressing. For example, when the amorphous carbon is deposited, it can be patterned by lithography. A pattern can be applied to the substrate, and the amorphous carbon can be applied. Then, the pattern can be removed and the hot press operation can be performed, yielding a patterned surface.

Post-patterning means patterning after the hot-pressing process. Post-patterning can include cutting and removing the unwanted regions of a whole graphene sheet to create well-defined graphene structures. A laser or electron beam can be used to pattern the graphene substrate while it is still attached to the metal template. The graphene substrate can also be annealed by using a laser or by simply heating the graphene under an atmosphere hydrogen-argon ($H_2$—Ar) gas mixture. Annealing of the graphene can used to enhance the quality of the graphene substrate by reducing irregularities at the intersection of adjacent graphene crystals. The same laser can be used to both pattern and anneal the graphene substrate. The laser power required for the annealing process is lower than that used for the patterning process. For example, the graphene layers can be patterned in an interlocking diamond shape structure. Alternatively, the graphene layers can be patterned in a grid bar structure.

The patterns of each graphene layer can be parallel or orthogonal to each other. For example, the first graphene layer and the second graphene layer can each be patterned to form bars or lines in the graphene layer. The bars or lines of the first graphene layer can be placed perpendicular to bars or lines of the second graphene layer to form a grid bar structure. Alternatively, the first graphene layer and the second graphene layer can each be patterned with a diamond shape. The diamonds shapes of the first graphene layer can be placed perpendicular (e.g., in the X-direction) to the diamond shapes of the second graphene layer (e.g., in the Y-direction) to form an X-Y diamond grid.

Chemical vapor deposition (CVD) refers to a chemical process used to produce high-purity, high-performance solid materials where the substrate is exposed to one or more volatile precursors, which react and/or decompose on the substrate surface to produce the desired deposit. Relevant CVD methods include inductively coupled plasma CVD (ICP-CVP), plasma enhanced CVD (PECVD), and thermal CVD.

The amorphous carbon can be applied to the substrate prior to pressing by known methods, such as by sputtering, evaporation, or CVD. The amount of amorphous carbon can be controlled in order to control the thickness of the resulting graphene film. In some instances, the resulting graphene film can have a thickness of less than 1 nm.

The thickness of a graphene layer can be determined by known methods, such as by atomic force microscopy, photoemission electron microscopy, and transmission electron microscopy.

EXEMPLIFICATION

Figure 3A:
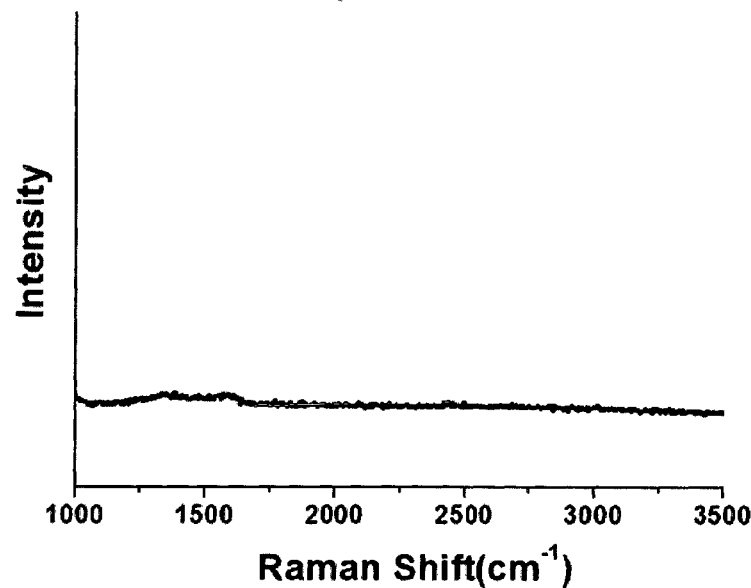
FIGS. 3A and 3B are Raman spectroscopy measurement of: a) amorphous carbon; and b) the product resulting from hot pressing amorphous carbon at 2,100° C. and 40 MPa, respectively.
Figure 3B:
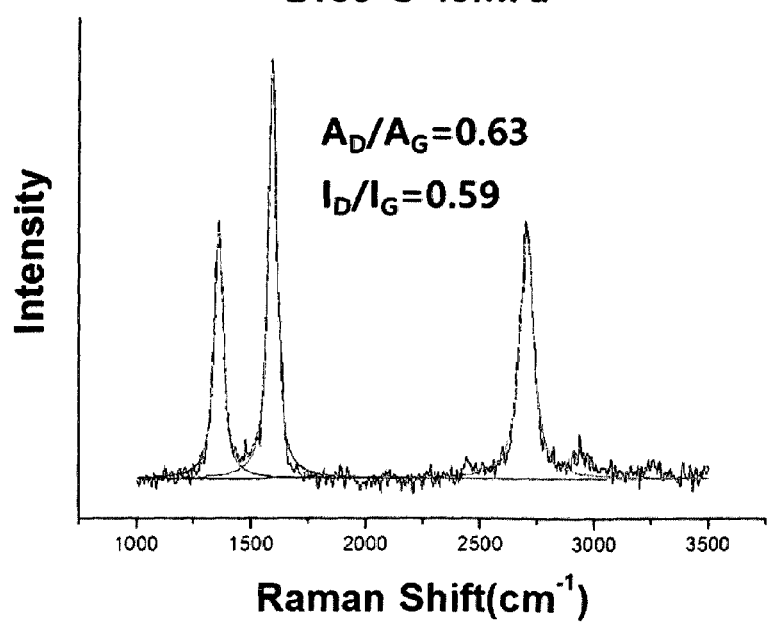

A first experiment was performed that demonstrates the formation of graphene from amorphous carbon. FIG. 3A is a Raman spectroscopy measurement of amorphous carbon prior to a hot pressing operation. FIG. 3B is a Raman spectroscopy measurement of the product resulting from hot pressing the amorphous carbon at 2,100° C. and 40 MPa for 30 minutes on graphite foil. The $I_D/I_G$ ratio shows improved crystallinity.

Figure 4A:
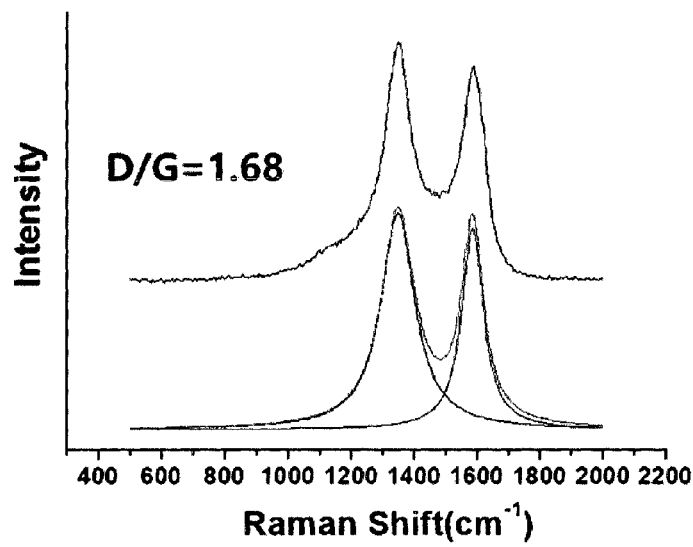
FIGS. 4A and 4B are Raman spectroscopy measurement of: a) the product resulting from hot pressing amorphous carbon at 1,400° C. and 50 MPa for 2 hours; and b) the product resulting from hot pressing amorphous carbon at 1,400° C. and 100 MPa for 2 hours, respectively.
Figure 4B:
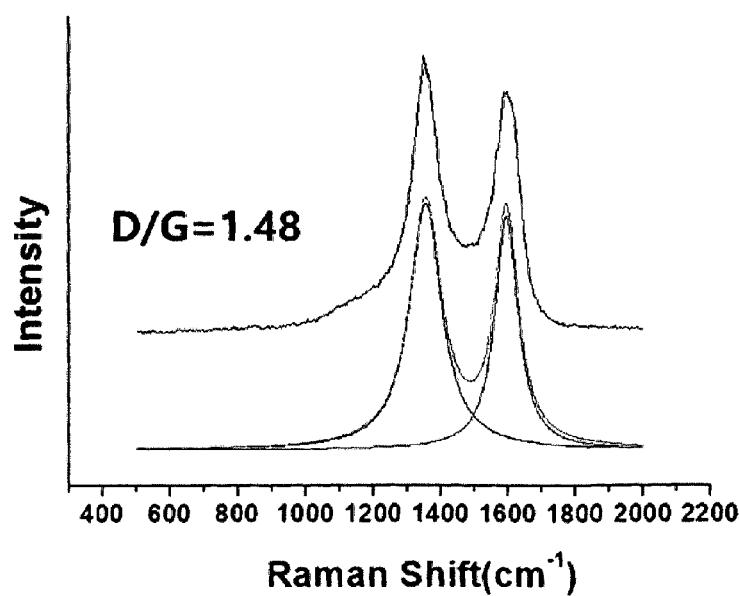

A second experiment demonstrates the formation of graphene from amorphous carbon. FIG. 4A is a Raman spectroscopy measurement of the product resulting from hot pressing amorphous carbon at 1,400° C. and 50 MPa for 2 hours on graphite foil. FIG. 4B is a Raman spectroscopy measurement of the product resulting from hot pressing amorphous carbon at 1,400° C. and 100 MPa for 2 hours on graphite foil. The Raman spectroscopy of FIG. 4B shows improved crystallinity, as evidenced by the decreased D/G ratio (i.e., the $A_D/A_G$ ratio).

A third experiment demonstrates the impact of the temperature and pressure on the density and conductivity of the resulting graphene. For each Sample of Table 2, the starting raw material is amorphous carbon that was hot pressed for one hour on graphite foil. As can be seen, increasing the pressure increases the both the density and the conductivity of the resulting graphene. Additionally, increasing the temperature also increases both the density and conductivity of the resulting graphene. When the measured conductivity is converted into sheet resistance, we observe a low resistance per square (<0.25 Ohm/square). Sheet resistance can be calculated from the measured conductivity according to Formula (I):

$$\sigma = \frac{1}{\rho} = \frac{1}{(Rs)(t)} \qquad (I)$$

where σ is the conductivity, ρ is resistivity, Rs is sheet resistance, t is thickness.

TABLE 2

| Sample No. | Pressure (MPa) | Temperature (° C.) | Density for C (g cm$^{-3}$) | Conductivity (S m$^{-1}$) |
|---|---|---|---|---|
| 1 | 10 | 800 | 0.361 | 1.5 × 10$^3$ |
| 2 | 40 | 800 | 0.492 | 2.9 × 10$^3$ |
| 3 | 10 | 1,300 | 0.492 | 3.4 × 10$^3$ |
| 4 | 40 | 1,300 | 0.515 | 4.6 × 10$^3$ |
| 5 | 10 | 1,700 | 0.490 | 3.7 × 10$^3$ |
| 6 | 40 | 1,700 | 0.595 | 7.7 × 10$^3$ |
| 7 | 10 | 2,100 | 0.634 | 5.7 × 10$^3$ |
| 8 | 40 | 2,100 | 0.947 | 9.4 × 10$^3$ |

INCORPORATION BY REFERENCE AND EQUIVALENTS

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A method of making graphene, comprising:
   hot pressing amorphous carbon:
   at a pressure between about 10 MPa and about 40 MPa;
   at a temperature between about 800° C. and about 1,300° C.; and
   for a duration between about 5 minutes and about 10 hours, to form graphene.

2. The method of claim 1, wherein the duration is between about 5 minutes and about 3 hours.

3. The method of claim 1, wherein the duration is between about 5 minutes and about 60 minutes.

4. The method of claim 1, wherein the duration is between about 1 hour and about 10 hours.

5. The method of claim 1, wherein the duration is between about 1 hour and about 3 hours.

6. The method of claim 1, wherein the ordered carbon product is formed on a non-planar substrate.

7. The method of claim 1, further comprising depositing the amorphous carbon on to a substrate prior to hot pressing the amorphous materials.

8. The method of claim 7, wherein the amorphous carbon is deposited by chemical vapor deposition.

9. The method of claim 7, wherein the amorphous carbon is deposited by physical vapor deposition.

10. The method of claim 9, wherein the amorphous carbon is deposited by sputtering.

11. The method of claim 9, wherein the amorphous carbon is deposited by evaporation.

12. The method of claim 7, wherein the amorphous carbon formed by carbonization of a polymeric material coated on the substrate.

13. The method of claim 12, wherein the polymeric material is poly(methyl methacrylate), polydimethylsiloxane, poly(p-phenylene-1,3,4-oxadiazole), or polyimide.

* * * * *